United States Patent [19]
Wong et al.

[11] Patent Number: 5,404,033
[45] Date of Patent: Apr. 4, 1995

[54] APPLICATION SPECIFIC INTEGRATED CIRCUIT AND PLACEMENT AND ROUTING SOFTWARE WITH NON-CUSTOMIZABLE FIRST METAL LAYER AND VIAS AND CUSTOMIZABLE SECOND METAL GRID PATTERN

[75] Inventors: Daniel Wong, San Jose; Anthony Y. Wong, Saratoga, both of Calif.

[73] Assignee: Swift Microelectronics Corporation, San Jose, Calif.

[21] Appl. No.: 174,896

[22] Filed: Dec. 23, 1993

Related U.S. Application Data

[63] Continuation-in-part of Ser. No. 932,796, Aug. 20, 1992, abandoned.

[51] Int. Cl.⁶ ............................................ H01L 27/10
[52] U.S. Cl. .................................... 257/202; 257/211; 257/209
[58] Field of Search ................ 257/210, 209, 206–208, 257/202, 211

[56] References Cited

U.S. PATENT DOCUMENTS

| | | | |
|---|---|---|---|
| 4,295,149 | 10/1981 | Balyoz et al. | 257/211 |
| 4,412,240 | 10/1983 | Kikuchi et al. | 257/211 |
| 4,742,383 | 5/1988 | Fitzgerald | 257/211 |
| 4,875,971 | 10/1989 | Orbach | 156/644 |
| 4,924,287 | 5/1990 | Orbach | 257/204 |
| 4,933,738 | 6/1990 | Orbach | 257/202 |
| 4,960,729 | 10/1990 | Orbach | 437/101 |
| 5,049,969 | 9/1991 | Orbach | 257/204 |
| 5,111,273 | 5/1992 | Orbach | 257/204 |

*Primary Examiner*—Robert P. Limanek
*Assistant Examiner*—Alexander Oscar Williams
*Attorney, Agent, or Firm*—Thomas E. Schatzel

[57] ABSTRACT

An embodiment of the present invention is a customizable integrated circuit including a basic cell diffusion of four transistors in a substrate. A first metallization layer includes a plurality of connective strips that electrically connect to the basic cell by a plurality of contacts. A second metallization layer, after a first patterning and chemical etch, comprises an orthogonal matrix of conductors that are electrically connected to corresponding connective strips by a plurality of vias that are respectively positioned at an intersection of orthogonal conductors. A second patterning and chemical etch of the second metallization layer configures the basic cell according to a user's specification.

7 Claims, 9 Drawing Sheets

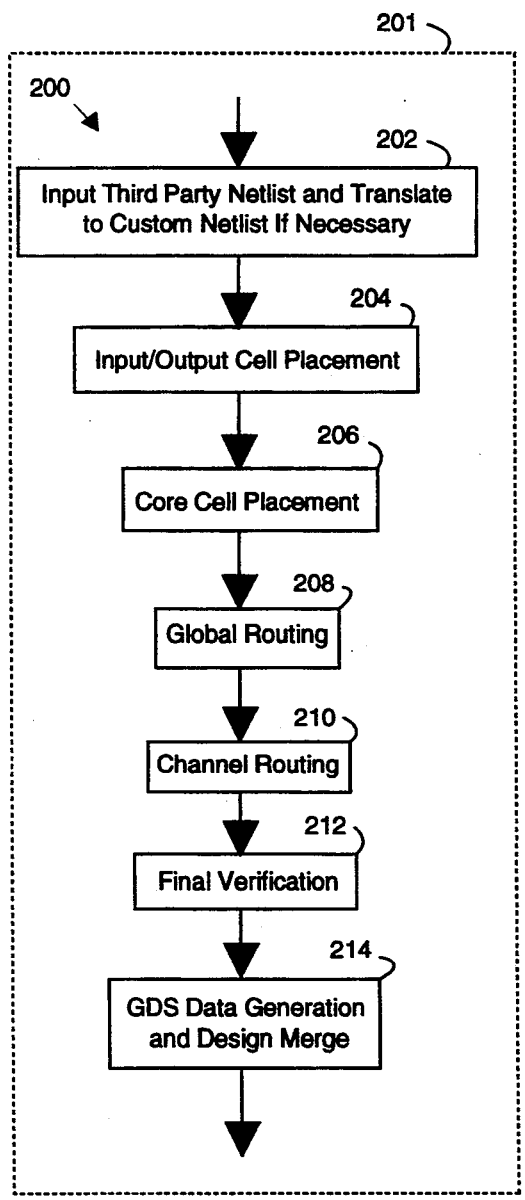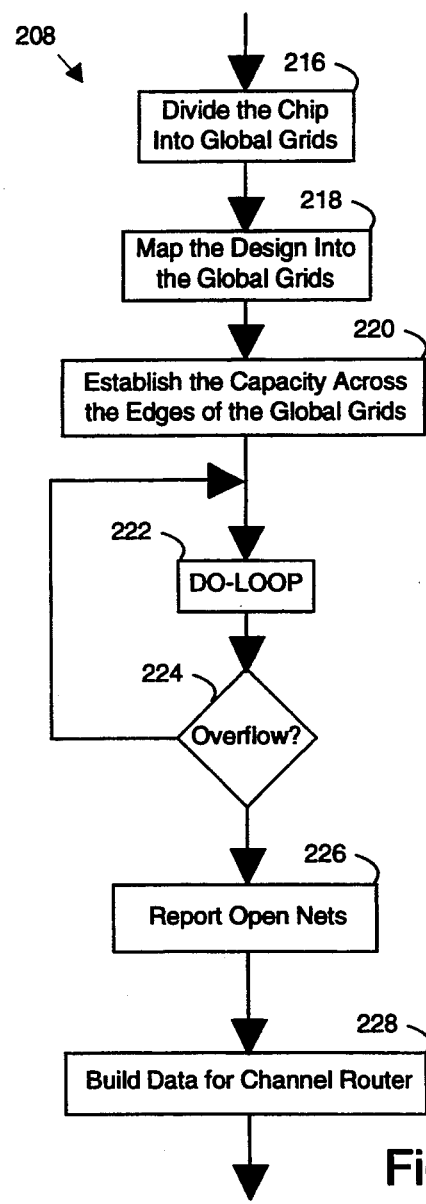
Fig. 9
Fig. 10

5,404,033

APPLICATION SPECIFIC INTEGRATED CIRCUIT AND PLACEMENT AND ROUTING SOFTWARE WITH NON-CUSTOMIZABLE FIRST METAL LAYER AND VIAS AND CUSTOMIZABLE SECOND METAL GRID PATTERN

RELATED APPLICATION

This application is a continuation-in-part of an earlier filed application Ser. No. 07/932,796, filed Aug. 20, 1992.

BACKGROUND OF THE INVENTION

1. Field of the Invention

The present invention relates generally to semiconductors and more specifically to devices comprising a plurality of gates that have been processed through to the second metal deposition and are thereafter customized with the aid of specialized computer placement and routing software for a particular application in one step by a single customized etch of the second metal pattern, or in two steps by a first standard pattern etch followed a second custom pattern etch of the second metal.

2. Description of the Prior Art

The advantages of high density integrated circuit technology were initially unavailable for use in designs that had low production runs. The initial engineering costs of a fully custom chip were too much to amortize over low volumes of devices. Huge manufacturing batches of thousands and tens of thousands of chips sharing one design were needed to realize scales of economies that are the hallmark of modern semiconductor processing.

The introduction of application specific integrated circuits (ASICs) and gate arrays lowered the number of devices a single design had to produce to be economical. This was accomplished by standardizing cells of transistors and logic gates and constraining users to define the required interconnections necessary to realize the desired functionality. Schematic capture and Boolean algebra software front-ends have emerged to make the placement and routing easier for a user to specify and whole functions, such as shift registers, UARTs, and CPUs are now available as cell libraries for use in a user's automatic placement and routing of a custom design.

Zvi Orbach, et al., describe in U.S. Pat. No. 4,875,971, issued Oct. 24, 1989, a technique for production of customized integrated circuits from finished blanks where portions of the metal conductors are removed at a plurality of metal layers in the finished blank using a single mask. Metal I and metal II layers are generally arranged in mutually perpendicular orientation so as to define a grid. Vias interconnect the metal layers and contact layer, and an insulating layer separates them all. A passivation layer is formed over the metal II layer. The metal I and metal II layers are such that they are always exposed for etching at locations where removal thereof may be desired. For customization, a photoresist layer is deposited over the passivation layer such that an application specific mask may be used to expose the photoresist layer. The application specific mask defines locations at which metal is to be removed from either the metal I layer or the metal II layer.

Zvi Orbach describes in U.S. Pat. No. 4,924,287, issued May 8, 1990, an integrated circuit including transistors and fusible links interconnecting the transistors such that selective fusing of the links can define an electronic function. Groups of transistors and links are definable into cells which include logic functions (e.g. gates, flip-flops and registers) and analog functions (e.g. op-amps and analog switches). The fusible links are expressly not electrically programmable, but rather are cut by an apparatus that scans the surface of the device and directs on the surface "a source of fusing energy." This energy would typically be a laser beam energetic enough to cut through the metal.

Zvi Orbach, et al., describe in U.S. Pat. No. 4,933,738, issued Jun. 12, 1990, a selectably customizable semiconductor device having first and second metal layers disposed in two different planes and include elongated strips with conductive branches. Metal I is formed into strips that lie in an "east-west" orientation and metal II is formed into strips that lie orthogonal to metal I strips in a "north-south" orientation. A sharing of vias is possible and an advantage of enhanced compactness is claimed thereby. Fuse links for device customization are provided on branch strips.

Zvi Orbach, et al., describe in U.S. Pat. No. 4,960,729, issued Oct. 2, 1990, a technique for providing radiation formable conductive link (antifuse) in an integrated circuit. Aluminum and amorphous silicon form the basic antifuse link. A laser radiation diffuses the aluminum into the amorphous silicon forming a highly conductive aluminum doped silicon bridge. Antifuse links act as vias between metal I and metal II layers and therefore can be programmed to configure various circuit functions.

Zvi Orbach, et al., describe in U.S. Pat. No. 5,049,969, issued Sep. 17, 1991, a selectably customizable semiconductor device including a first and second metal layers disposed in parallel planes. Each metal layer comprises elongated strips orthogonal to one another in their respective planes. Fusible conductive bridges join adjacent pairs of strips in one plane. Branch strips connect one of the fusible conductive bridges at locations intermediate to first and second fusible links. Laser cutting is employed to etch some of the fusible links. All of the fusible links are formed on the second metal layer. As such, no holes in the insulating layer are used such that personalization of a device does not require a change in the fabrication process.

Zvi Orbach, et al., describe in U.S. Pat. No. 5,111,273, issued May 5, 1992, an integrated circuit that has an insulation layer disposed over a collection of semiconductor elements, such as transistors formed on a silicon substrate, with discrete apertures overlying fusible links. Predetermined combinations of the fusible links are fused to produce particular functions from the combinations of the semiconductor elements. The fusible links include a first group that make connections between individual semiconductor elements to define functional groups, and a second group that provide a plurality of connections among the functional groups. The fusible links are fused by "application of energy locally to the links themselves . . . ". A Florod Corporation laser cutter is described in one example. No electrical connections are provided for fusing, which "greatly simplifies the design and increases the circuit carrying capacity of integrated circuits."

SUMMARY OF THE PRESENT INVENTION

It is therefore an object of the present invention to provide a semiconductor device that may be customized by a second etch of the second metallization layer.

It is another object of the present invention to provide a computer placement and routing software to assist in the customization of a semiconductor device that is customized by etching only the second metallization layer.

Briefly, a customizable integrated circuit embodiment of the present invention includes a basic cell diffusion of four transistors in a substrate. A non-user-customizable first metallization layer includes a plurality of connective strips that electrically connect to the basic cell by a plurality of contacts. Vias are provided for interconnection and are also non-user-customizable. A second metallization layer is user-customizable and comprises an orthogonal matrix of conductors that are electrically connected to corresponding connective strips by the vias that are respectively positioned at an intersection of orthogonal conductors. A patterning generated by computer placement and routing software and a subsequent chemical etch of the second metallization layer is used in combination to customize the device according to a user's specification.

An advantage of the present invention is that it provides a customizable integrated circuit.

Another advantage of the present invention is that it provides an inexpensive structure for user customization.

These and other objects and advantages of the present invention will no doubt become obvious to those of ordinary skill in the art after having read the following detailed description of the preferred embodiments which are illustrated in the various drawing figures.

IN THE DRAWINGS

FIG. 9 is a flowchart of a computer-aided design flow of the present invention;

FIG. 10 is a flowchart of the global routing procedure included in the computer-aided design flow of FIG. 9;

DETAILED DESCRIPTION OF THE PREFERRED EMBODIMENTS

Figure 1A:
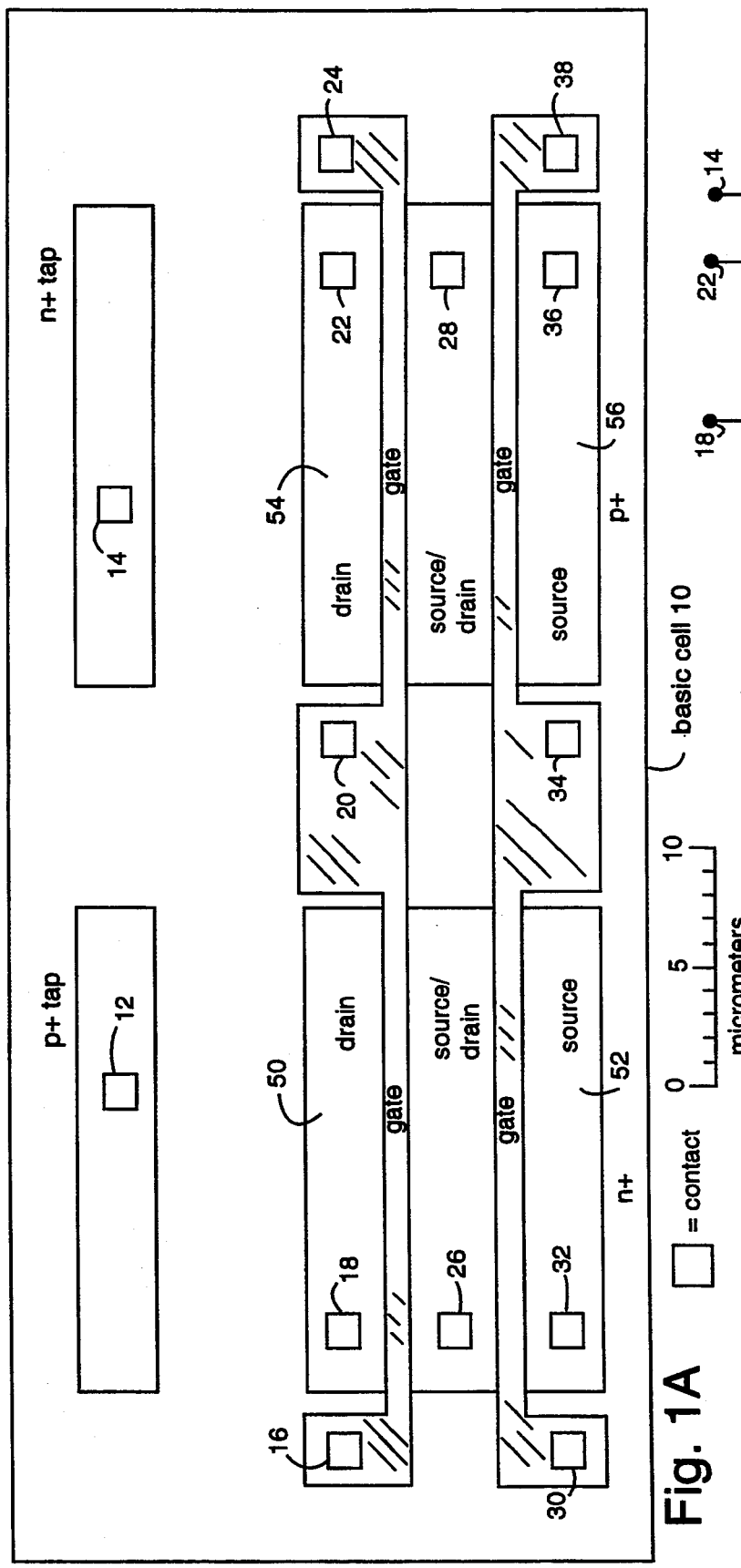
FIG. 1A is top view of a single basic cell diffusion of four transistors according to the present invention.
Figure 1B:
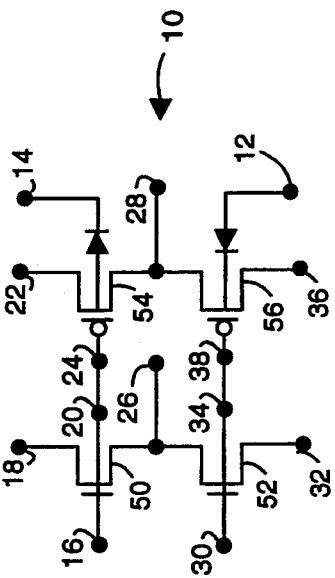
FIG. 1B is a schematic representation of the diffusion of FIG. 1A.

FIGS. 1A and 1B illustrate a basic four transistor cell, hereinafter referred to by the general reference numeral 10. FIG. 1A illustrates the diffusions for cell 10 and a plurality of even numbered contacts 12 through 38. A pair of n-channel transistors 50 and 52 are such that the source of transistor 50 is common to the drain of transistor 52 and the junction is reached by contact 26. Similarly, a pair of p-channel transistors 54 and 56 are such that the source of transistor 54 is common to the drain of transistor 56 and the junction is reached by contact 28. The gates of transistors 50 and 54 are coupled together and connected to contacts 16, 20 and 24. The gates of transistors 52 and 56 are coupled together and connected to contacts 30, 34 and 38. Transistors 50, 52, 54 and 56 may be coupled together and to external circuits in various configurations to form a plurality of logic functions. These logic functions include inverter, AND-gate and OR-gate functions. Complex logic functions are assembled by interconnecting a plurality of cells 10 adjacent to one another on a common integrated circuit (IC) substrate.

Figure 2:
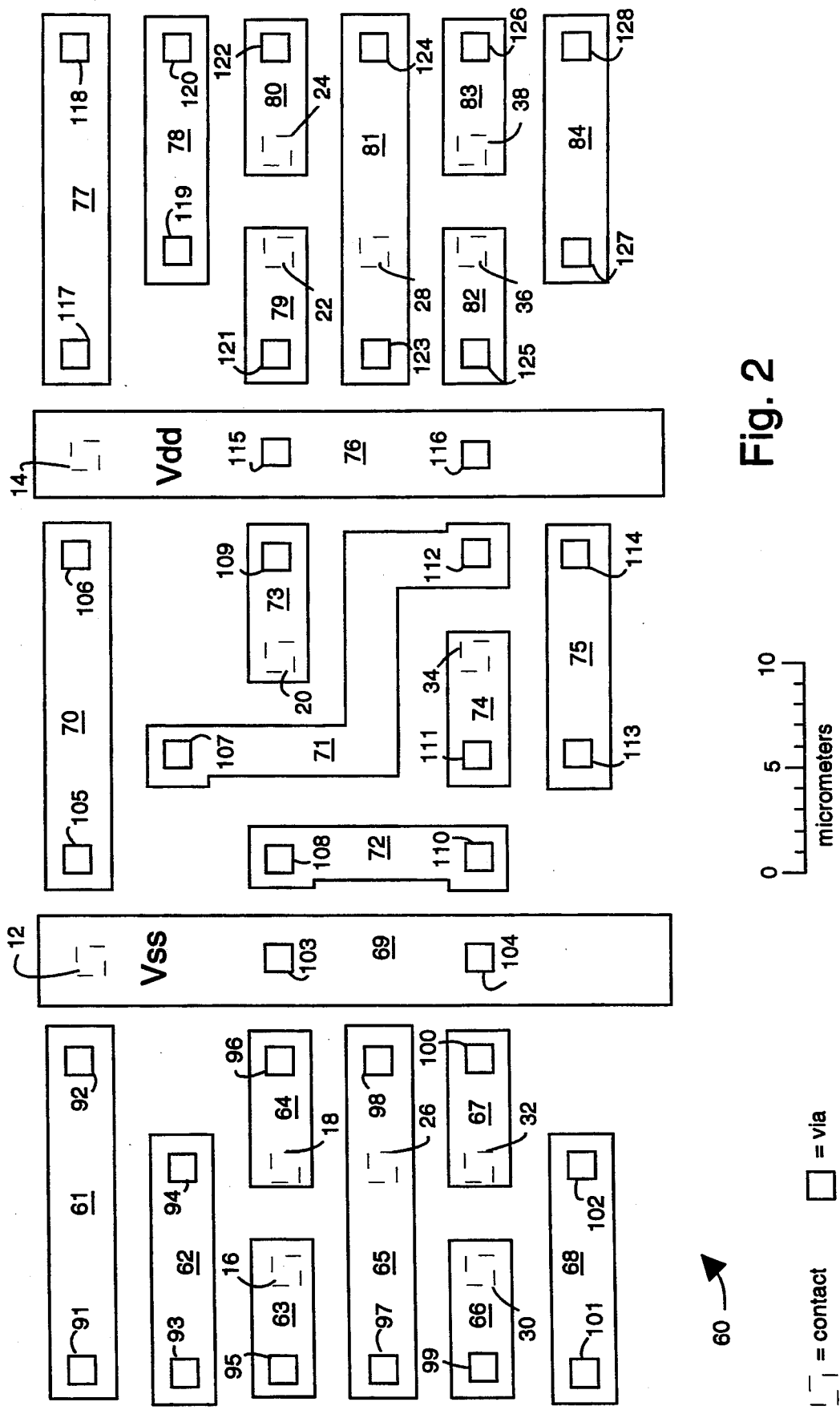
FIG. 2 is a diagram of the metal I layer that is deposited over the diffusion of FIG. 1A.

FIG. 2 represents a first metallization (metal I) layer 60 that is deposited over the diffusion of FIG. 1A and electrically isolated by a first insulation layer, e.g. comprising silicon dioxide. Even numbered contacts 12 through 38 make electrical connection to metal I layer 60 at a plurality of corresponding connective strips 61–84. Connective strips 69 and 76 respectively are reserved as power supply rails to conduct voltages Vss and Vdd. Metal I layer 60 allows a plurality of vias 91–128 to be strategically placed for connection of cell 10 to a second metallization (metal II) layer 130 (FIG. 3) that is deposited over metal I layer 60 and a second insulation layer. A system of overpass connections may be completed for metal I layer 60 with metal II layer 130. For example, connective strips 73 and 79, 71 and 82, and 70 and 77 are respectively connected by overpasses between vias 109 and 121, 112 and 125, and 106 and 117. Connective strips 63, 66 and 65 respectively bring the gates of transistors 50 and 52 and the junction of the source of transistor 50 and the drain of transistor 52 directly to the left edge, as shown in relation to FIG. 2, of cell 10. Connective strips 81, 80 and 83 respectively bring the junction of the source of transistor 54 and the drain of transistor 56, and the gates of transistors 54 and 56 directly to the right edge, as shown in relation to FIG. 2, of cell 10.

Figure 3:
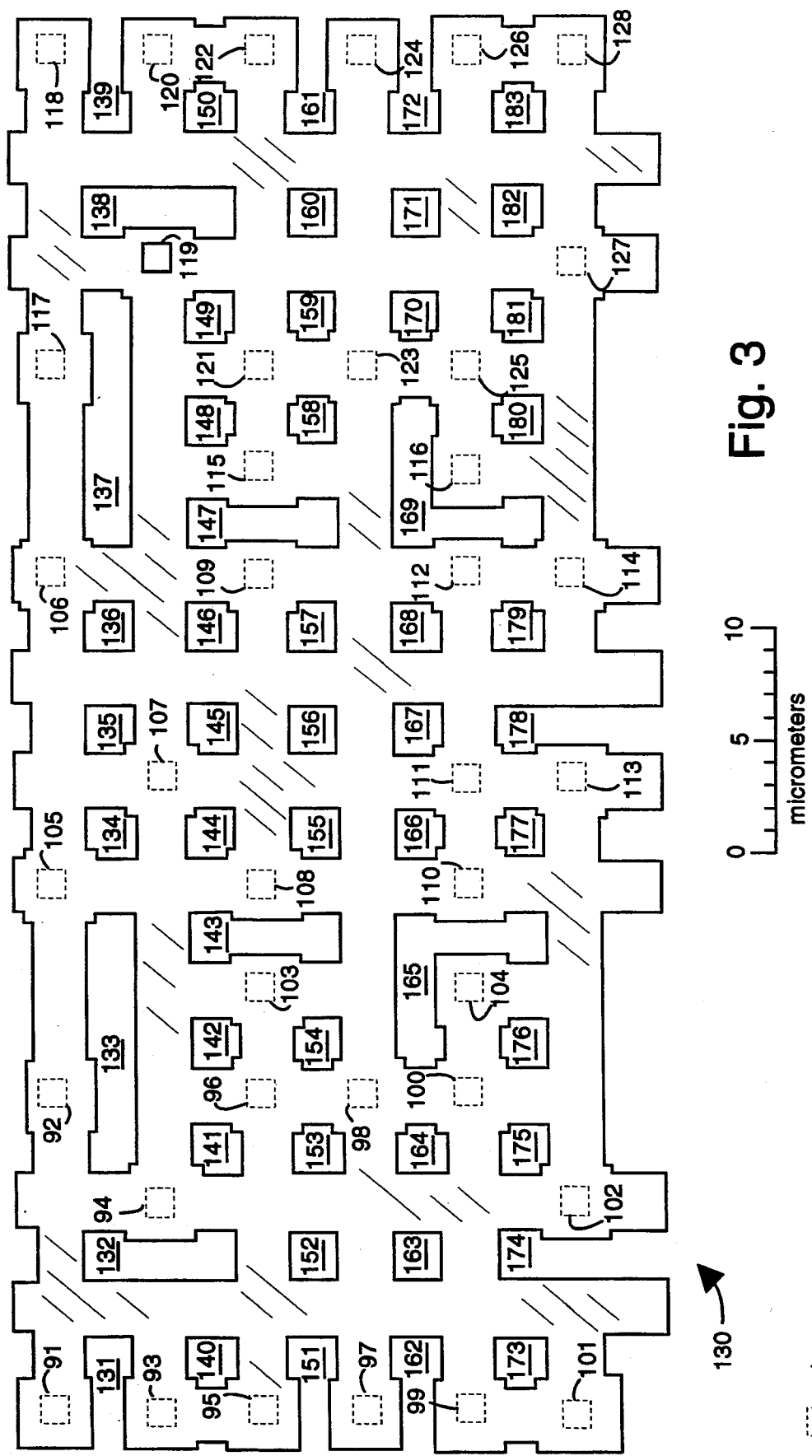
FIG. 3 is a diagram of the metal II layer that is deposited over the diffusion of FIG. 1A.

FIG. 3 illustrates the appearance of metal II layer 130 after a blanket deposition of metal and a first patterning etch. In general, metal II layer 130 is in the form of an orthogonal mesh or matrix of crisscrossing conductors. Metal II layer 130 receives a second patterning etch after a user has finally determined how cell 10 should be configured to suit a particular application. In the interim, metal II layer 130 receives a thin oxide passivation layer to protect against scratches that might otherwise occur during later handling and transport. The thin oxide passivation layer can easily be removed later by a global oxide etch. Special etch windows as required by some prior art devices are not necessary with the present invention. If transportation will not be necessary, it is permissible to eliminate the passivation step. Metal II layer 130 includes a plurality of openings 131-183 that are a first step in forming a wiring interconnect of vias 91-128. The second step in forming the wiring interconnect comprises the second etch of metal II layer 130 and has the effect of removing parts of layer 130 such that, for example, various openings 131-174 could be joined. Openings 131, 132, 133, 137, 138, 139, 143, 147, 151, 161, 162, 165, 169, 172, 174 and 178 are special in that conductors in the wiring matrix of metal II layer 130 have been permanently removed, because the links that would be left have been predetermined to be prohibited connections that would defeat the functioning of cell 10 if not removed. Openings 131-183 include notches that promote compliance with spacing and overlap design rules for contacts and permit cell 10 with associated metal I layer 60 and metal II layer 130 to be shrunk in size further than would be possible without such notches. Openings 131-183 reduce the amount of metal material that must be removed in the second etch.

Alternatively, the second metal layer can be completely etched in one step. The pattern of metal II layer 130 in FIG. 3 is logically ANDed with a user's pattern of customization to arrive at a composite second metal interconnect.

Figure 4:
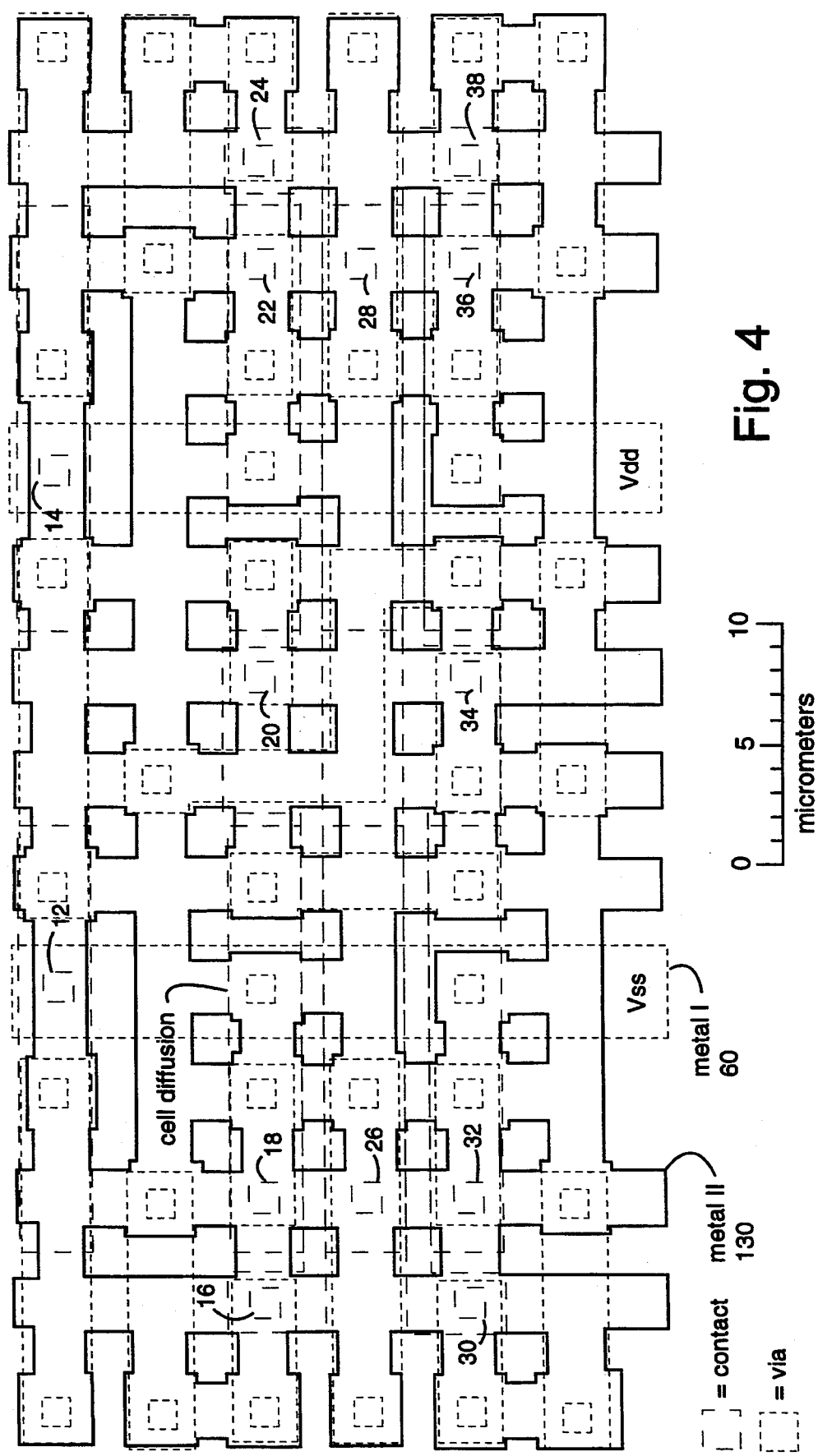
FIG. 4 is a composite diagram of the diffusion of FIG. 1A, the metal I layer of FIG. 2 and the metal II layer of FIG. 3.

FIG. 4 is a composite of FIGS. 1, 2 and 3, and shows how metal I layer 60 and metal II layer 130 are related in position to the diffusion of FIG. 1A.

Figure 5:
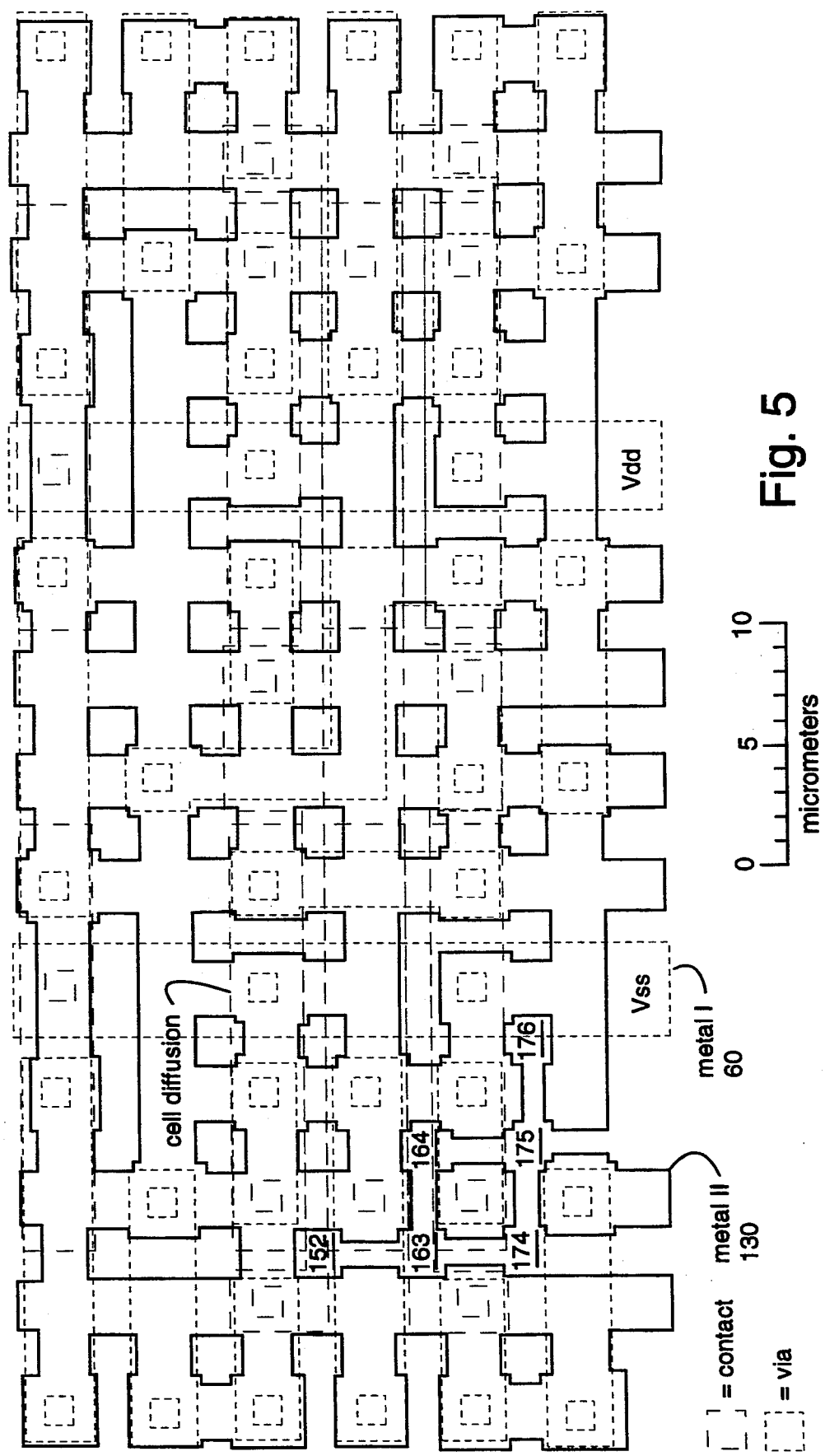
FIG. 5 is a composite diagram similar to that of FIG. 4 and in which several links have been etched away in the metal II layer to configure the cell of FIGS. 1A and 1B.

FIG. 5 illustrates metal II layer 130 after a second etch has customized and configured cell 10. Links between openings 152, 163, 164, 174, 175 and 176 have been removed.

Figure 6:
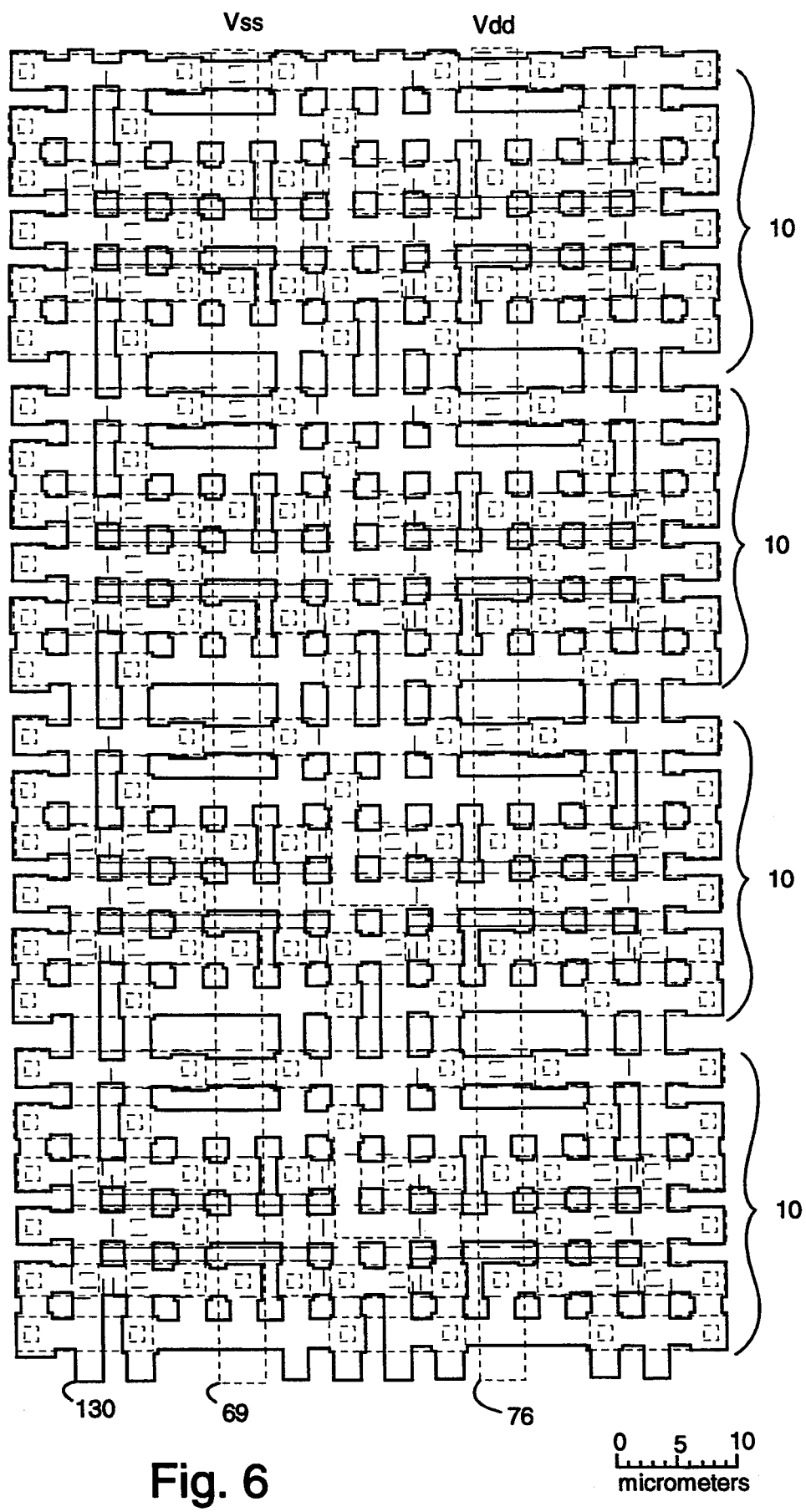
FIG. 6 is a composite diagram of four cells, each cell similar to that shown in FIG. 4, and in which the four cells are arranged side-by-side.

FIG. 6 diagrams a plurality of individual cells 10 which have been placed side-by-side on a common IC substrate to form a metal layer programmable logic core. Such an IC is customizable by a user. To customize the IC, specialized software for the purpose may be used to generate a list of links in metal II layer 130 that must be opened to configure cells 10 according to the user's ultimate circuit design. Connective strips 69 and 76 carry Vss and Vdd supply voltages for all adjacent cells 10. Interconnects between one cell 10 and another are accomplished by leaving vertical links (in relation to FIG. 6) in metal II layer 130 after the second etch. Input and output for cells 10 may be carried by leaving horizontal links (in relation to FIG. 6) in metal II layer 130 after the second etch.

Figure 7A:
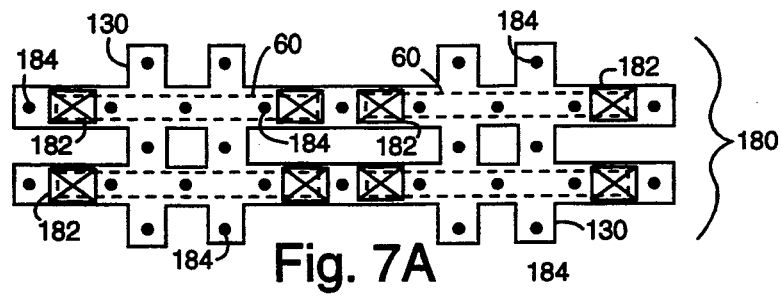
FIG. 7A is a top elevational view of a global routing channel.
Figure 7B:
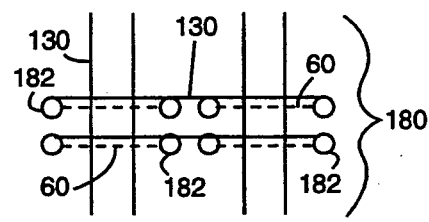
FIG. 7B is a schematic equivalent of the global routing channel of FIG. 7A.

FIGS. 7A and 7B illustrate a global routing channel 180. FIG. 7A represents the physical appearance of channel 180 and FIG. 7B is an example of how the channel 180 can be shown in simplified schematic form. A plurality of general purpose vias 182 interconnect first metal 60 and second metal 130. A plurality of etch-links 184 indicate where the second metal 130 may be etched away to customize the pattern of second metal 130. In FIG. 7B, open etch-links 184 are simply representable in such schematic form as discontinuities in the lines drawn that represent the second metal 130.

Figure 8:
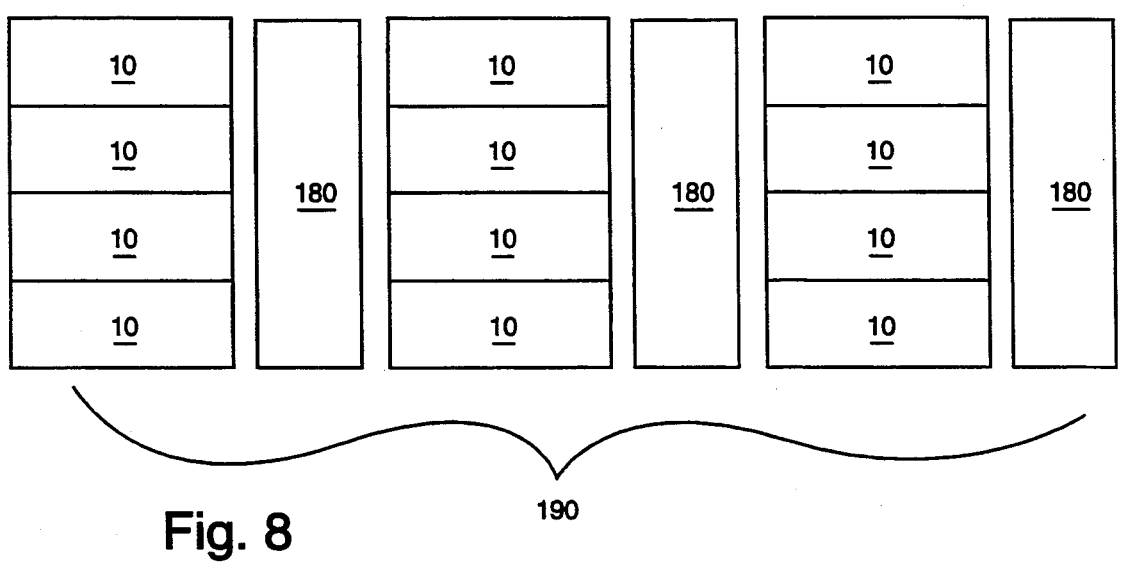
FIG. 8 is a diagram of the relationship in a chip layout of a plurality of global routing channels interleaved between pluralities of cells.

In FIG. 8, a device 190 is configured from arrays of cells 10 interleaved by pluralities of global routing channels 180. The global routing channels are used to make inter-connections between cells 10. A routing channel unit is formed by two intersecting grids second layer metal 130 that are connected together.

FIG. 9 is a flowchart of a computer-aided design (CAD) flow 200 of the present invention. Preferably, CAD flow 200 is implemented in software that generates a computer program machine code for a personal computer or workstation, such as the IBM-PC or compatible machine. As such, these computer programs are deliverable on a magnetic floppy disk 201 for loading into a users machine or are maintained at a facility for customizing devices 190 for users with custom designs embodied in a netlist of interconnections.

CAD flow 200 comprises a step 202 that translates a user or third part design interconnect netlist for customizing device 190 to a standardized netlist for use by all the later steps. A step 204 allows the user to control the placement and locations of bonding pads and input/output (I/O) cells to duplicate an original PCB design. A step 206 comprises automatic placement programs that decide the locations of the core cell based on the hint of I/O cell locations and to realize the goals of minimum wire length and timing. The basic algorithms used may include well-known ones borrowed from academia, e.g., Simulated Annealing, with some customization to adapt it to CAD flow 200 and device 190. Steps 202, 204 and 206 are essentially conventional and those skilled in the art may employ common techniques to construct the first part of CAD flow 200.

A step 208 performs global control of the routing resource such that the channel routing performed later becomes feasible. A maze routing technique is preferred and is modified over conventional systems to account for the unique EC pin requirement of device 190 which does not allow the input pins to accessed at the same time.

A "bean-packing" technique is embodied in a step 210 to do the channel routing of the second metal layer, e.g., within channel 180 (FIG. 8). A maze routing technique is also subsequently used to ensure channel routing completion.

A final verification is performed in a step 212 in which the routed data is extracted into the netlist form and compared against the original netlist to ensure data consistency.

A step 214 generates industry-standard GDS-format data and merges it with library data to complete a manufacturing data set. This step is also more-or-less conventional and further details necessary for implementation are common knowledge in the industry.

FIG. 10 is a flowchart of the global routing procedure 208 of FIG. 9. A step 216 divides device 190 into global grids. A step 218 maps the design into each of the global grids. A step 220 establishes the capacity across the edges of the global grids. A step 222 is a do-loop procedure in computer programming code that can be expressed in pseudo-code in the following way:

```
do {
    for each net {
        maze route the net {
            pick up two shortest pin pair of the net
            maze route the pin pair
            disable the EC pin after connection
            update the demand across the edges of the
            trace
        }
        if there is overflow, e.g., demand > capacity, do {
            update the cost of crossing the overflowed
            edges
        }
    } until all nets completed or more than X
```

A step 224 is written in computer programming code and can be expressed in pseudo-code in the following way:

```
if there is overflow {
    maze route the rest of the nets
}.
```

A step 226 reports the open nets that are left. A step 228 builds the data that will be necessary for the channel routing of step 210 (FIG. 9).

Figure 11:
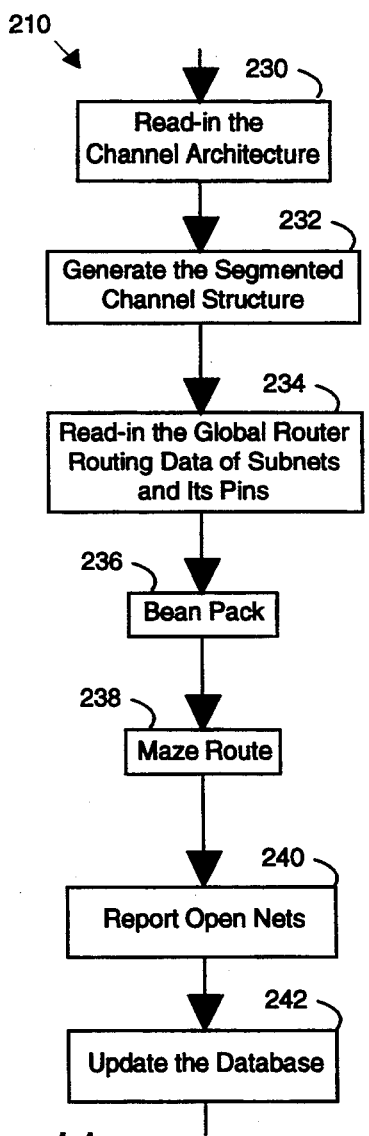
FIG. 11 is a flowchart of the channel routing procedure included in the computer-aided design flow of FIG. 9.

FIG. 11 is a flowchart of the channel routing procedure 210 included in the computer-aided design flow of FIG. 9. A step 230 reads in the special channel architecture of device 190 (FIG. 8). A step 232 generates a segmented channel structure. For example, the first metal layer 60 (FIG. 2) is comprised of a number of segments that must be used for interconnecting and their placement is fixed and not re-locatable by CAD flow 200. A step 234 reads in the global router (step 208, FIG. 9) routing data of subnets and its pins. A bean packing of second metal layer wire interconnections in the channels 180 is performed in a step 236, and is written in computer programming code that can be expressed in pseudo-code in the following way:

```
do }
    for each track which contains sequence of segments
        at the same Y-coordinate {
        scan segments from left to right {
            examine all incomplete subnets that ended
                at this segment {
                sum up the cost to put this subnet
                    at unused segments
                }
            find the best set of subnets to fill
                in the track with the best
                cost
            report the completed subnets
            mark the used segments
            }
        until all the subnets completed or
            tracks examined .
```

A step 238 is written in computer programming code and can be expressed in psuedo-code in the following way:

```
for each incomplete subnet {
    pick each two-pin pair from left to right, do {
        maze routing based on the architecture of
        device 190 with free second metal and
        segmented first metal
    }
}.
```

A step 240 reports all the open subnets and open nets. A step 242 updates the database.

Figure 12:
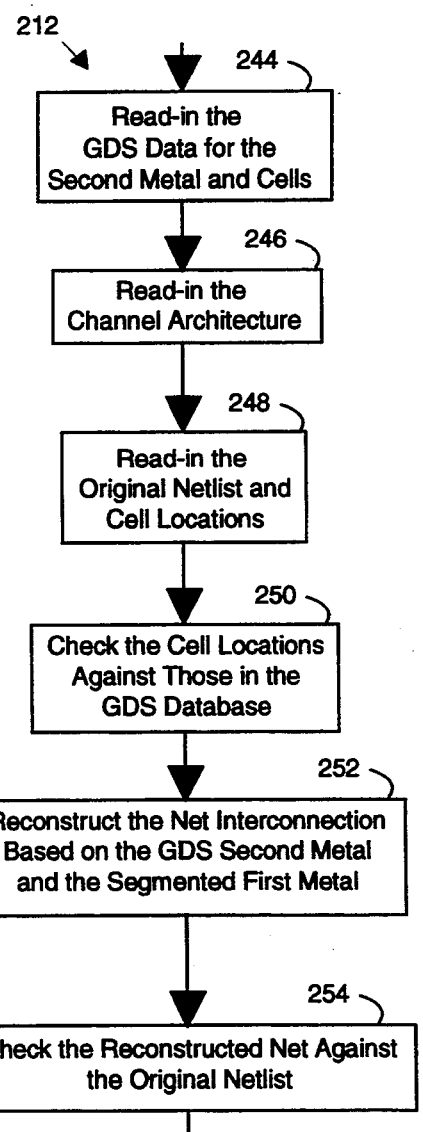
FIG. 12 is a flowchart of the final verification procedure included in the computer-aided design flow of FIG. 9.

FIG. 12 is a flowchart of the final verification procedure 212 included in the computer-aided design flow of FIG. 9. A step 244 reads in the GDS-formatted data that contains the second metal 130 (FIG. 3) and cells 10 (FIGS. 1 and 8) used in device 190. A step 246 reads in the channel architecture of device 190. A step 248 reads in the original netlist and cell locations. A step 250 checks these cell locations against the ones included in the GDS-formatted database. A step 252 reconstructs the net interconnection based on the GDS-formatted second metal, e.g., metal 130, and the segmented first metal, e.g., metal 60. A step 254 checks such reconstructed net against the original netlist, e.g., such as was input in step 202 (FIG. 9).

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A gate array integrated circuit for subsequent customization of an included integrated circuit (IC) with a single-etch of a second metal layer, comprising:
   a plurality of identical basic cells arranged into rows columns within said IC wherein each basic cell includes a diffusion of four transistors;
   a non-exposed first metallization layer including a plurality of non-intersecting connective strips that are electrically connected to the basic cells by a plurality of contacts; and
   a second metallization layer exposed on a surface of said IC for providing for susceptibility to subsequent customization by metal etching and including an orthogonal mesh of conductors that are electrically connected to corresponding said connective strips by a plurality of vias positioned at respective intersections of said mesh of conductors and having a first plurality of evenly spaced uniform small openings between a first plurality of intersections of said mesh of conductors and a first plurality of conductive links between a second plurality of intersections of said mesh of conductors that connect each one of said intersections to less than all of a set of corresponding surrounding adjacent intersections in said first plurality of intersections.

2. The IC of claim 1, wherein:
   the second metallization layer includes openings in said orthogonal mesh of conductors that isolate portions of the basic cell.

3. The IC of claim 1, wherein:
   the second metallization layer includes a plurality of notches in openings in said orthogonal mesh of conductors for minimization of the size of the basic cell.

4. A customizable gate array integrated circuit (IC) system, comprising:
   a plurality of identical basic cells arranged into rows and columns within said IC wherein each basic cell includes a diffusion of four transistors in a common semiconductor substrate;
   a non-exposed first metallization layer including a plurality of non-intersecting connective strips that are electrically connected to respective basic cells by a corresponding plurality of contacts;
   a second metallization layer disposed on a surface of said IC for providing for susceptibility to subsequent customization by metal etching and including an orthogonal mesh of conductors that are electrically connected to corresponding said connective strips by a plurality of vias positioned at respective intersections of said mesh of conductors and having a first plurality of evenly spaced uniform small openings between a first plurality of intersections of said mesh of conductors and a first plurality of conductive links between a second plurality of intersections of said mesh of conductors that connect each one of said intersections to less than all of a set of corresponding surrounding adjacent intersections in said first plurality of intersections;

a thin oxide passivation layer overlying the second metallization layer and providing for handling and transportation scratch prevention and constituted to be subsequently removable by a global oxide etch; and a plurality of global routing channels including etch-links that interconnect the plurality of basic cells.

5. The system of claim 4, further comprising:

computer programming software on a disk for computer-aided design (CAD) that includes computer instructions for:

translating a user or third party design interconnect netlist;

allowing a user to control the placement and locations of bonding pads and input/output (I/O) cells to duplicate an original design;

automatically placing the locations of core cells based on said I/O cell locations and to minimize wire length and timing delays;

global control of the routing resource such that a later channel routing becomes feasible, wherein a maze routing technique is used which does not allow input pins to be simultaneously accessed;

channel routing of the second metallization layer; and final verification in which any routed data is extracted into a netlist form and compared against an original netlist to ensure data consistency.

6. A gate array integrated circuit system for subsequent customization of an included integrated circuit (IC) with a single-etch of a second metal layer, comprising:

a plurality of identical basic cells arranged into rows and columns within said IC wherein each basic cell includes a diffusion of four transistors;

a non-exposed first metallization layer including a plurality of non-intersecting connective strips that are electrically connected to the basic cell by a plurality of contacts;

a second metallization layer exposed on a surface of said IC for providing for susceptibility to subsequent customization by metal etching and including an orthogonal mesh of conductors that are electrically connected to corresponding said connective strips by a plurality of vias positioned at respective intersections of said mesh of conductors and having a first plurality of evenly spaced uniform small openings between a first plurality of intersections of said mesh of conductors and a first plurality of conductive links between a second plurality of intersections of said mesh of conductors that connect each one of said intersections to less than all of a set of corresponding surrounding adjacent intersections in said first plurality of intersections; and computer programming software on a disk providing for a patterning of only the second metallization layer by selective etching and including a computer-implemented process for inputting a design netlist and translating said design into a list of said first plurality of conductive links are to be etched-open between said second plurality of intersections in said mesh of conductors.

7. The system of claim 6, wherein:

the computer programming software on disk further comprises computer-implemented process means for core cell placement of the basic cells, global routing of second metallization connections amongst the basic cells, channel routing between the basic cells and final verification of the circuit functionality of the basic cells interconnected by said etched and patterned second metallization layer for a customization of said IC according to said design netlist.

* * * * *